(12) United States Patent
Boesch et al.

(10) Patent No.: US 11,240,905 B2
(45) Date of Patent: Feb. 1, 2022

(54) METHOD FOR PRODUCING A PRINTED CIRCUIT BOARD-COOLING BODY STRUCTURE

(71) Applicant: HELLA GMBH & CO. KGAA, Lippstadt (DE)

(72) Inventors: Dirk Boesch, Lippstadt (DE); Frank Brinkmeier, Lippstadt (DE); Markus Goesling, Lippstadt (DE); Christian Koerdt, Geseke (DE); Werner Koesters, Lippstadt (DE); Frank Muenzner, Lippstadt (DE); Sebastian Nordhoff, Lippstadt (DE); Marc Schlueter, Luegde (DE); Thomas Wiese, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 16/895,784

(22) Filed: Jun. 8, 2020

(65) Prior Publication Data

US 2020/0305271 A1    Sep. 24, 2020

Related U.S. Application Data

(63) Continuation of application No. PCT/EP2018/083417, filed on Dec. 4, 2018.

(30) Foreign Application Priority Data

Dec. 8, 2017  (DE) .................... 10 2017 129 311.6

(51) Int. Cl.
*H05K 3/00* (2006.01)
*H05K 1/02* (2006.01)
(Continued)

(52) U.S. Cl.
CPC ............ *H05K 1/0203* (2013.01); *F21S 45/47* (2018.01); *F21S 45/49* (2018.01); *H05K 3/0044* (2013.01);
(Continued)

(58) Field of Classification Search
USPC ........................................... 29/832, 842, 844
See application file for complete search history.

(56) References Cited

U.S. PATENT DOCUMENTS 4,215,360 A * 7/1980 Eytcheson .............. H01L 21/56
174/529
6,297,961 B1 * 10/2001 Koizumi .............. H05K 1/0204
361/720
(Continued)

FOREIGN PATENT DOCUMENTS

DE    10 2012 211 143 A1    1/2014
DE    10 2010 016 534 B4    6/2015
(Continued)

*Primary Examiner* — Donghai D Nguyen
(74) *Attorney, Agent, or Firm* — Muncy, Geissler, Olds & Lowe, P.C.

(57) ABSTRACT

The invention relates to a method for producing a printed circuit board—cooling body structure and such a printed circuit board—cooling body structure, in particular for arrangement in a lighting device of a vehicle, the method comprising at least the following steps: providing a base plate; coating a carrier side of the base plate with an insulation layer and/or with a solder resist; fitting the carrier side with at least one electronic component and applying cooling rib bodies to a cooling side of the base plate opposite the carrier side.

7 Claims, 5 Drawing Sheets

(51) Int. Cl.
*F21S 45/49* (2018.01)
*F21S 45/47* (2018.01)
*H05K 3/30* (2006.01)
*H05K 3/46* (2006.01)

(52) U.S. Cl.
CPC .......... *H05K 3/303* (2013.01); *H05K 3/4644* (2013.01); *H05K 2201/066* (2013.01)

(56) References Cited

U.S. PATENT DOCUMENTS

| | | | |
|---|---|---|---|
| 7,699,500 B2 * | 4/2010 | Takemoto | H05K 1/021 |
| | | | 362/294 |
| 7,796,392 B2 * | 9/2010 | Bertram | H05K 3/0061 |
| | | | 361/712 |
| 8,348,460 B2 | 1/2013 | Bachl et al. | |
| 10,555,431 B2 | 2/2020 | Perales et al. | |
| 2011/0316035 A1 | 12/2011 | Shin et al. | |

FOREIGN PATENT DOCUMENTS

| | | |
|---|---|---|
| DE | 10 2013 226 972 A1 | 7/2015 |
| EP | 1 395 100 A1 | 3/2004 |
| EP | 1 890 343 A1 | 2/2008 |
| FR | 3 045 829 A1 | 6/2017 |

* cited by examiner

METHOD FOR PRODUCING A PRINTED CIRCUIT BOARD-COOLING BODY STRUCTURE

This nonprovisional application is a continuation of International Application No. PCT/EP2018/083417, which was filed on Dec. 4, 2018, and which claims priority to German Patent Application No. 10 2017 129 311.6, which was filed in German on Dec. 8, 2017, and which are both herein incorporated by reference.

BACKGROUND OF THE INVENTION

Field of the Invention

The present invention relates to a method for producing a printed circuit board—cooling body structure, as well as such a printed circuit board—cooling body structure, in particular for arranging in a lighting device of a vehicle, in particular for a headlight of a vehicle.

Description of the Background Art

For example, DE 10 2010 016 534 B4, which corresponds to U.S. Pat. No. 8,348,460, discloses a printed circuit board—cooling body structure, wherein a light-emitting diode is applied to the circuit board which is to be cooled by means of the cooling body. The circuit board that carries the light-emitting diode is arranged on the cooling body with a heat-conducting layer and a foil, the foil being a heat transfer barrier, in particular for the insulation of the metallic cooling body, so that the heat-dissipating effect of the light-emitting diode by the cooling body is reduced.

From DE 10 2012 211 143 A1, another printed circuit board—cooling body structure is known. A printed circuit board serves as a carrier for receiving electronic components and associated conductor tracks. The electronic components and the conductor tracks are applied to one side of the carrier. A separate cooling body is arranged on the opposite side of the base plate, which has a cuboid base region which is attached to the cooling body. The cuboid base region has a flat surface, which is aligned flush with a cooling side of the base plate. However, the transfer from the printed circuit board to the contact side of the cooling body also results in a heat transfer barrier, which also reduces the effect of the heat dissipation of the electronic components on the printed circuit board.

Finally, DE 10 2013 226 972 A1 discloses a printed circuit board—cooling body structure with a printed circuit board which is located in a direct arrangement on a cooling body, which is made of plastic and which is injection molded onto the flexible printed circuit board in an injection molding tool. Such a structure is, however, not suitable for applications in lighting devices of vehicles, since light-emitting diodes are used in a lighting device, which develop significantly more heat, which such a flexible cooling body is not capable of dissipating. However, the circuit board in a direct arrangement on the cooling body achieves particularly good heat transfer, and the structure is made possible by the fact that the plastic cooling body has an insulating effect and the conductor tracks can be applied directly to the carrier side of the plastic body.

SUMMARY OF THE INVENTION

It is therefore an object of the present invention to provide a method for producing a printed circuit board—cooling body structure, and to provide such a printed circuit board—cooling body structure in which particularly effective heat dissipation of the electronic components, in particular the semiconductor light sources, is made possible, wherein the cooling body should have at least one cooling rib body. In particular, it should be possible to produce the cooling body from a metallic material.

In an exemplary embodiment, the invention includes the technical teaching that the method for producing the printed circuit board—cooling body structure comprises at least the following steps: providing a base plate, coating a carrier side of the base plate with an insulation layer and/or with a solder resist for fitting the carrier side with at least one electronic component and applying cooling rib bodies to a cooling side of the base plate opposite the carrier side.

A core idea of the invention is the simultaneous use of the base plate both as part of the cooling body as well as a carrier plate for conductor tracks and the electronic components, as these are known from circuit boards which comprise aluminum or copper substrates and on which the insulation layer and/or the solder resist and at least one electronic component are applied on the carrier side. The idea of the invention is, in particular, to provide a cooling side on the same base plate, to which at least one cooling rib body is applied. As a result, the number of heat transfers is reduced, since heat transfer from a circuit board, for example also comprising a copper or aluminum substrate, on a cooling body is no longer necessary since the base plate of the circuit board itself already forms the base plate of the cooling body. The invention thus provides a structural fusion of so-called IMS-PCBas (Insulated Metal Substrate-Printed Circuit Board, assembled) with the base plate of a metal cooling body, for example. The electronic components can be cooled much more efficiently by the cooling body.

The cooling rib bodies can be riveted for attachment to the base plate on the cooling side, producing riveted connections. The application of cooling rib bodies after applying the components that bind the circuit board, i.e., the insulation layer and/or the solder resist and the at least one electronic component, make it possible to provide a composite of the base plate and the applied components as a surface composite, before the cooling rib bodies are applied. The provision can thus take place in a similar way to the provision of an insulated metal substrate, the thickness of the base plate being selected correspondingly larger in order to achieve the cooling effect and to enable the cooling ribs to be securely applied. By providing rivet connections, no heat is introduced into the base plate in the connection process, as would be the case, for example, when welding or soldering. The riveting of the cooling rib bodies to the cooling side of the base plate and thus opposite the carrier side can be done such that the rivet connections are generated in a rivet area that does not coincide with the area in which, for example, electronic components and conductor tracks are applied to the carrier side of the base plate.

It is particularly advantageous if the insulation layer and/or the solder resist is locally removed in order to produce the rivet connections on the carrier side, thereby producing rivet areas. Since the base plate is initially provided as a continuous sheet, in particular in a composite of a panel, a number of clinching areas can be created in the generated rivet area with clinching, creating projections on the cooling side of the base plate. These projections on the cooling side enable the later attachment of the cooling rib bodies by means of rivet connections. The projections form the rivet itself, so that no further individual part has to be provided and the heat transfer into the connection can take place continuously in the uniform material of the base plate.

The rivet connections are produced with particular advantage by the axial upsetting of the projections against the clinching direction, wherein with an arrangement of the cooling rib bodies on the cooling side of the base plate, the projections are first fed through openings in formed base regions of the cooling rib bodies. In a simple manner, the base regions can be angled areas of the cooling rib bodies, which are laid flat on the cooling side of the base plate. If openings are provided in the base regions that correspond to the projections in the base plate, the cooling rib body can be applied in such a way that the projections protrude through the openings and the connection is established by upsetting the end region of the projections.

The base plate can be made of a metallic material and/or an aluminum material and/or it is provided that the base plate has a thickness of at least 1 mm to 5 mm and/or of 2 mm to 4 mm and/or of 3 mm. It has been found that for typical lighting applications in headlights of vehicles, lamps are used which form electronic components to be cooled, and a thickness of the base plate of 3 mm is regarded as advantageous. The aluminum material is particularly advantageous, wherein a copper material is also favorable as the material for the base plate.

A plurality of base plates can be provided in a composite of a panel, wherein the base plates are removed from the panel after the insulation layer and/or the solder resist has been locally removed from the carrier side and/or after the carrier sides have been fitted with the at least one electronic component. The integration of the base plate in the panel is maintained for as long as possible in order to simplify the handling of several base plates, with the riveting areas in particular being produced by means of deep milling on the carrier side, while the base plate is still part of the composite of the panel. As a result, the insulation layer and/or the solder resist can be removed locally. The application of conductor tracks and electronic components to the base plates can also be carried out when these are in the composite of the panel.

The invention further relates to a printed circuit board—cooling body structure having a cooling body and having a circuit board, wherein a base plate comprises a carrier side on which an insulation layer and/or a solder resist and at least one electronic component are arranged, and wherein the base plate has a cooling side on which cooling rib bodies are arranged. The other features, which are disclosed with the associated advantages in connection with the method, are also taken into account for the printed circuit board—cooling body structure according to the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
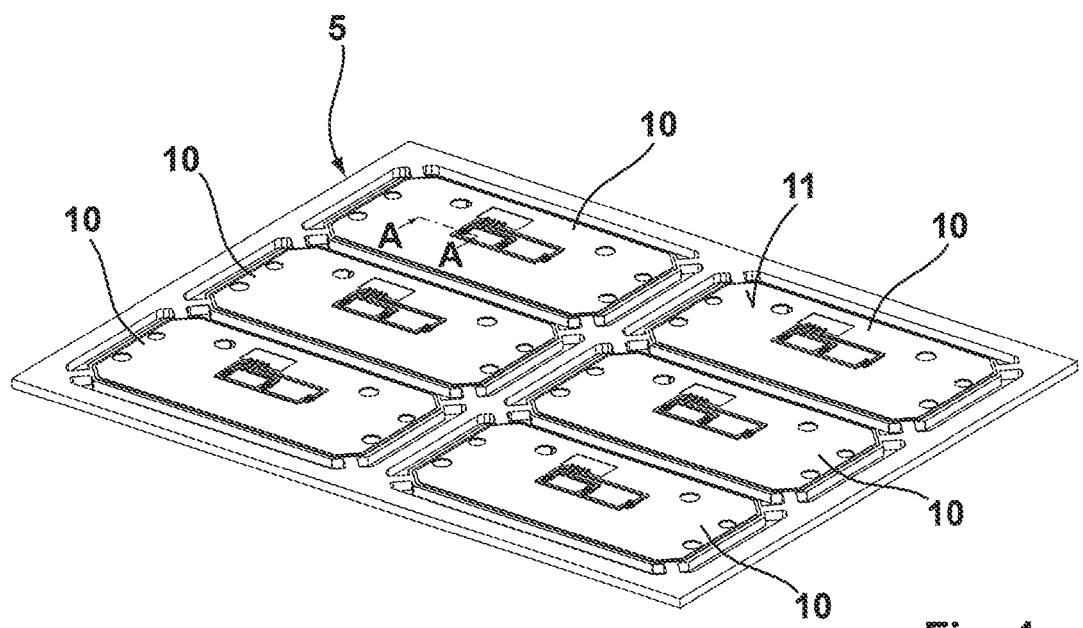
FIG. 1 is a perspective view of a panel comprising several base plates.

FIG. 1 shows a perspective view of a panel 5, which receives six base plates 10, for example. The base plates 10 serve as a base plate for a cooling body and at the same time as a carrier substrate of a printed circuit board for the application of a corresponding structure on a carrier side 11, which is shown pointing upwards.

Figure 2:
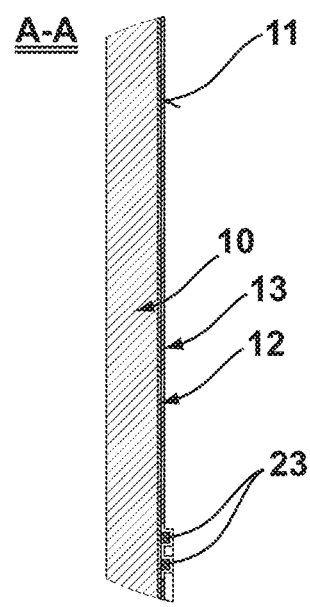
FIG. 2 is a sectional view A-A according to FIG. 1.

FIG. 2 shows a cross-sectional view according to the cross-sectional profile A-A, as shown in FIG. 1. The base plate 10 has a carrier side 11, to which an insulation layer 12 and a solder resist 13 are applied. On the carrier side 11 there are also conductor tracks 23 which rest on the insulation layer 12 when the solder resist 13 is removed.

Figure 3:
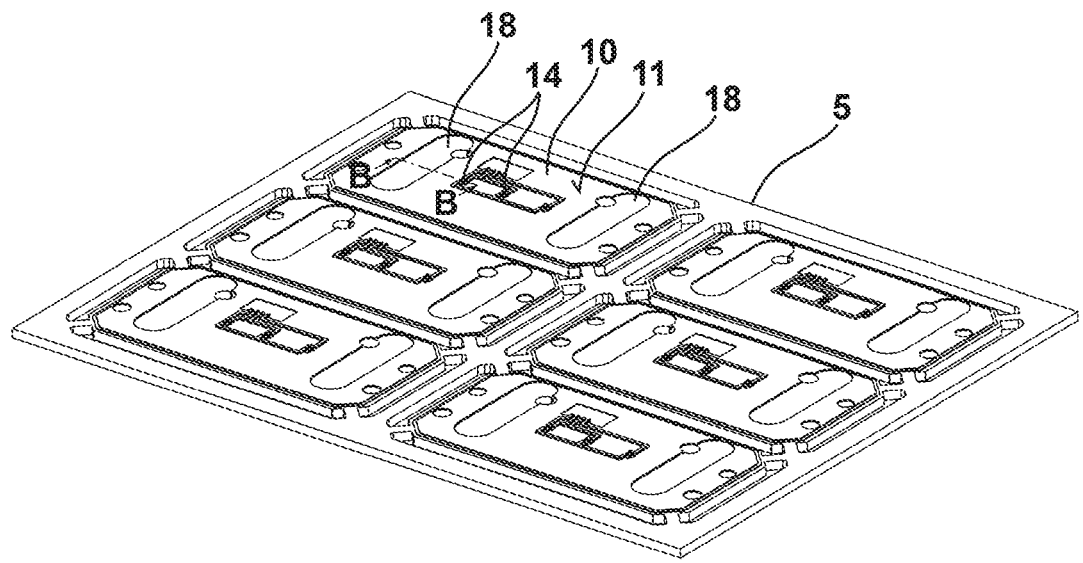
FIG. 3 is a perspective view of a panel having several base plates, on which further work steps have already been carried out.

FIG. 3 shows a further perspective view of the plurality of base plates 10 in the composite of a panel 5, wherein rivet areas 18 have been generated laterally to the arrangement of the electronic components 14 on the support side 11. The rivet areas 18 were produced by deep milling the carrier side 11, as a result of which at least the insulation layer and the solder resist were removed, as shown in cross section in FIG. 4.

Figure 4:
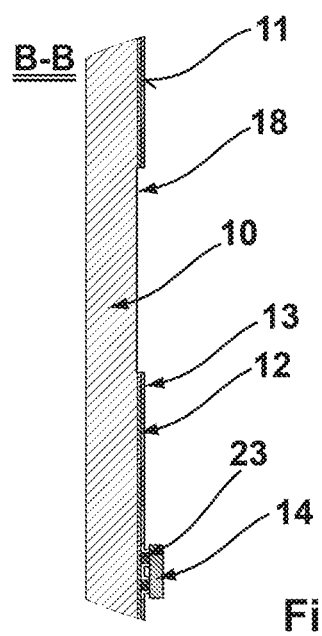
FIG. 4 is a cross-sectional view B-B according to FIG. 3.

FIG. 4 shows a cross-sectional view according to the cross-sectional profile B-B, and the rivet area 18 in which the insulation layer 12 and the solder resist 13 have been removed is shown on the carrier side 11 of the base plate 10. The coatings on the carrier side 11 are removed by deep milling, wherein the conductor tracks 23 and, for example, an electronic component 14 have already been applied to the carrier side 11.

Figure 5:
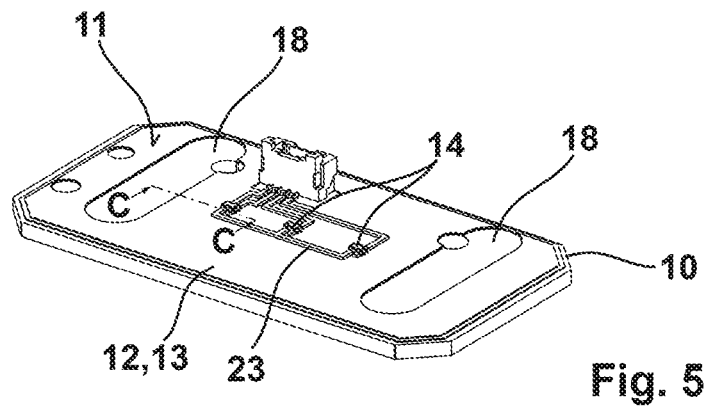
FIG. 5 is an isolated base plate in a perspective view.

FIG. 5 shows an isolated base plate 10 with the method steps performed according to the previous figures, so that the rivet areas 18, in which the insulation layer 12 and the solder resist were removed, were generated by deep milling and wherein on the carrier side 11 the conductor track 23 and the electronic components 14 are already applied.

Figure 6:
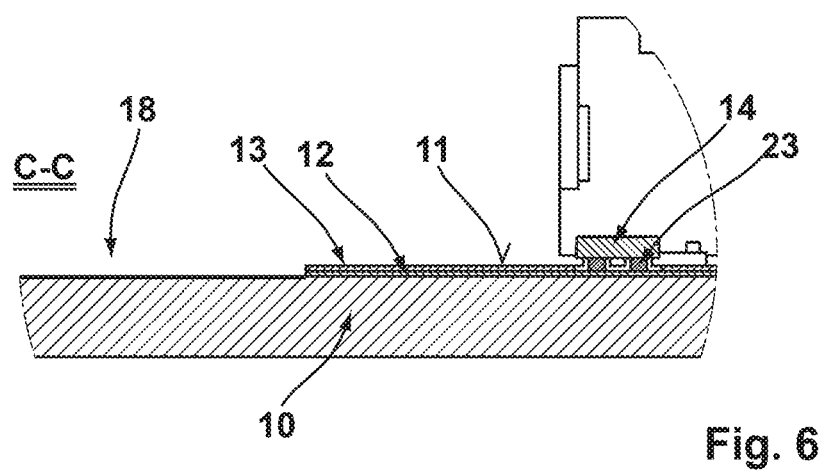
FIG. 6 is a cross-sectional view C-C according to FIG. 5.

FIG. 6 shows a detailed view of the section C-C according to FIG. 5. Analogously to FIG. 4, the rivet area 18 is shown, in which the insulation layer 12 and the solder resist 13 have been removed on the carrier side 11 of the base plate 10. The conductor track 23 and the electronic component 14 have already been applied to the carrier side 11. Here, the base plate 10 is in an isolated state, as shown in FIG. 5, in order to be fed to a subsequent process.

Figure 7:
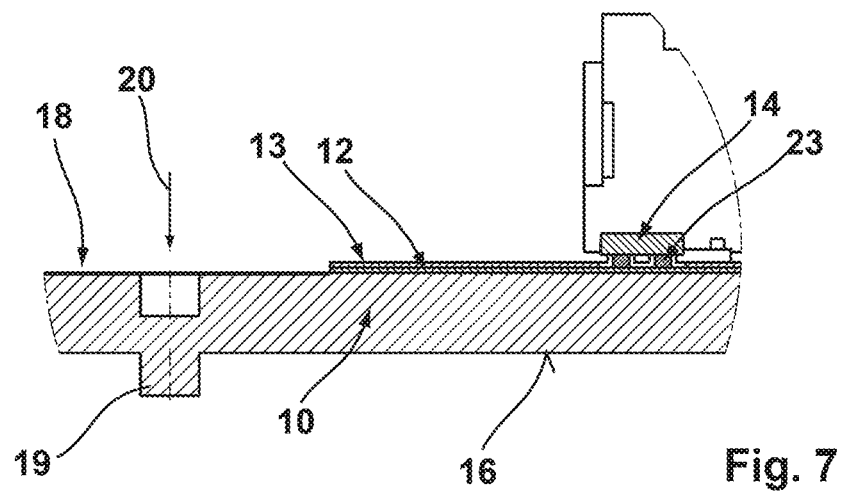
FIG. 7 is a detailed view of a rivet area of the base plate with a generated projection on a cooling side.

Further to FIG. 6, FIG. 7 shows the base plate 10 with the rivet area 18, in which the insulation layer 12 and the solder resist 13 have been removed, with the conductor tracks 23 and the electronic component 14 already being applied. Clinching has been carried out in the rivet area 18, which was performed in a clinching direction 20. This creates a projection 19 on the cooling side 16 of the base plate 10, which can serve for the later production of a riveted connection. In order to enable clinching in the clinching direction 20 without influencing the insulation layer 12 and the solder resist 13, the rivet areas 18 have been produced by deep milling.

Figure 8:
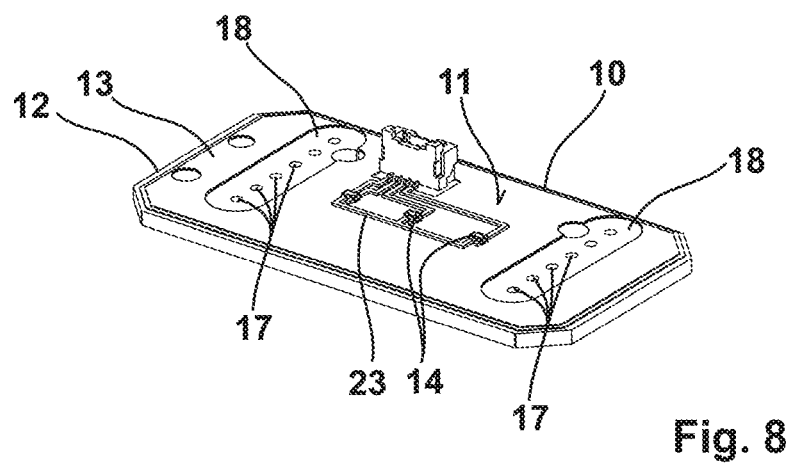
FIG. 8 is a view of the base plate with the rivet areas, in which several rivet connections are prepared.

FIG. 8 shows a perspective view of the base plate 10 with conductor tracks 23 and electronic components 14 applied to the support side 11, as well as the rivet areas 18 in which the plurality of rivet connections 17 are prepared. By means of the through-printing, the projections 19 are formed on the underside so that corresponding recesses are formed on the carrier side 11. The rivet areas 18 can be seen because the insulation layer 12 and the solder resist 13 have been removed, whereby it cannot be ruled out that the thickness of the base plate 10, for example made of aluminum or copper, is slightly reduced in the rivet areas 18 by the deep milling.

Figure 9:
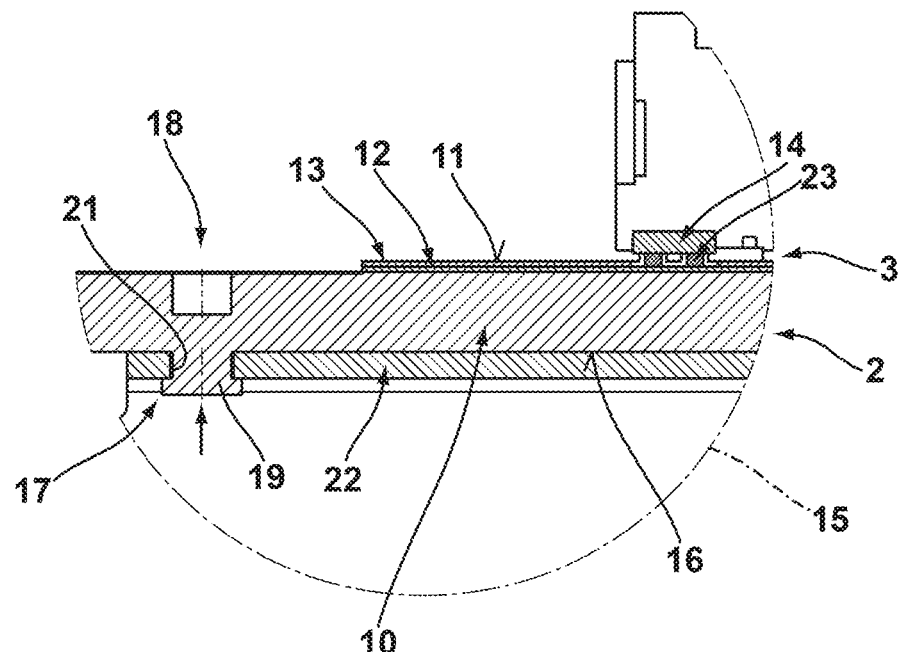
FIG. 9 is a detailed view of the base plate with the printed circuit board applied on the top side and the cooling rib body arranged on the underside and a finished riveted connection for connecting the cooling rib body to the base plate.

FIG. 9 shows a detailed view of the base plate 10 with the conductor tracks 23 and the electronic components 14 applied to the carrier side 11, as well as with the insulation layer 12 and the solder resist 13, which are removed in the rivet area 18. The projection 19 has been upset against the clinching direction shown in FIG. 7, after the projection 19 has been passed through an opening 21 in a base region 22 of a cooling rib body. The base region 22 is an angled area of the lamellar cooling rib body 15, which projects perpendicularly from the cooling side 16. The base region 22 can thus lie flat over its width against the cooling side 16 of the base plate 10. Due to the generated rivet connection 17, which can be done multiple times and is shown only once, a firm and heat-conducting connection between the base plate 10 and the cooling rib body 15 is created. The structure now shows a cooling body 2 and a printed circuit board 3 with the components applied to the carrier side 11, and on the opposite side 16, the same base plate 10 comprises the cooling rib bodies 15.

Figure 10:
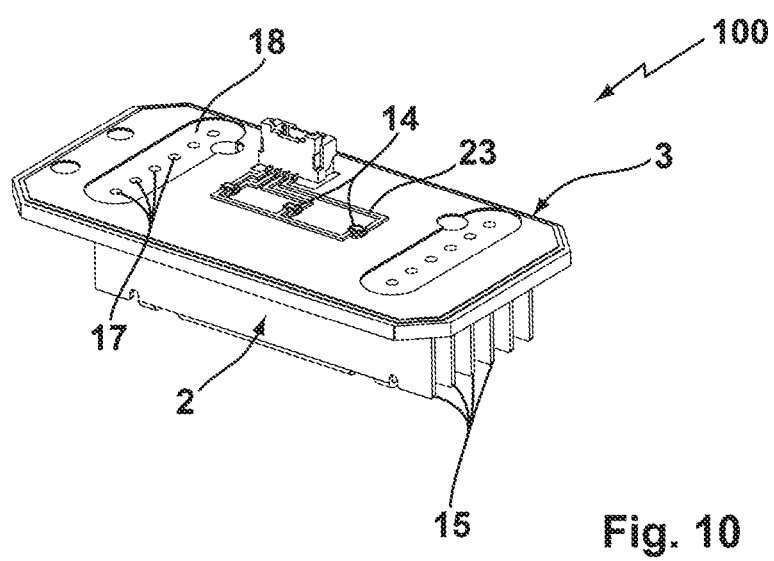
FIG. 10 is a perspective view of a printed circuit board—cooling body structure having a circuit board and having a cooling body.

This structure is shown again in a perspective view in FIG. 10, indicating a printed circuit board—cooling body structure 100 having a single, in particular metallic base plate 10. The cooling body 2 consists of the base plate 10 and the cooling rib bodies 15, and the circuit board 3 likewise comprises the base plate 10 and at least the conductor tracks 23 and the electronic components 14. In the rivet areas 18, the plurality of rivet connections 17 are produced which do not further impair the electrical function of the electronic components 14 arranged on the printed circuit board.

The result is a printed circuit board—cooling body structure 100 having electronic components 14, which are applied directly or via their conductor tracks 23 directly to the insulation layer 12 of the, in particular, metallic base plate 10. Since the cooling rib bodies 15 are arranged directly on the same base plate 10, minimal heat transfer barriers are created from the electronic component 14 to be cooled into the cooling rib bodies 15.

The embodiment of the invention is not limited to the preferred exemplary embodiment described above. Rather, a number of variants are conceivable which make use of the solution provided, even in the case of fundamentally different embodiments. All of the features and/or advantages resulting from the claims, the description or the drawings, including structural details, spatial arrangements and method steps, can be essential to the invention both individually as well as in a wide variety of combinations.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing a printed circuit board cooling body structure for arrangement in a lighting device of a vehicle, the method comprising:
   providing a base plate;
   coating a carrier side of the base plate with an insulation layer and/or with a solder resist;
   fitting the carrier side of the base plate with at least one electronic component; and
   attaching cooling rib bodies to a cooling side of the base plate located opposite the carrier side,
   wherein the cooling rib bodies are attached to the cooling side of the base plate by rivet connections, and
   wherein, to generate the rivet connections, portions of the insulation layer and/or the solder resist are removed from the carrier side of the base plate, such that rivet areas are created.

2. The method according to claim 1, wherein, after creating the rivet areas, clinching areas are created in the rivet areas via clinching the based plate in a clinching direction to generate projections that project from the cooling side of the base plate.

3. The method according to claim 2, wherein the projections are first passed through openings formed in base regions of the cooling rib bodies and the rivet connections are created by axial upsetting of the projections against the clinching direction.

4. The method according to claim 1, wherein the base plate is provided from a metallic material and/or from an aluminum material and/or that the base plate has a thickness of at least 1 mm to 5 mm.

5. The method according to claim 1, wherein the base plate is provided in a composite with another base plate in a panel.

6. The method according to claim 5, wherein, after the removal of the portions of the insulation layer and/or the solder resist from the carrier side of the base plate and/or after the fitting of the carrier side with at least one electronic component, the base plate is removed from the panel.

7. The method according to claim 1, wherein the rivet areas are created via deep milling on the carrier side of the base plate, in which the portions of the insulation layer and/or the solder resist are locally removed.

* * * * *